(12) United States Patent
Honma et al.

(10) Patent No.: US 8,038,050 B2
(45) Date of Patent: Oct. 18, 2011

(54) SOLDER BALL PRINTING APPARATUS

(75) Inventors: Makoto Honma, Tokyo (JP); Akio Igarashi, Tokyo (JP); Naoaki Hashimoto, Tokyo (JP); Noriaki Mukai, Tokyo (JP)

(73) Assignee: Hitachi Plant Technologies, Ltd., Tokyo (JP)

( * ) Notice: Subject to any disclaimer, the term of this patent is extended or adjusted under 35 U.S.C. 154(b) by 0 days.

(21) Appl. No.: 12/756,314

(22) Filed: Apr. 8, 2010

(65) Prior Publication Data
US 2010/0270357 A1    Oct. 28, 2010

(30) Foreign Application Priority Data

Apr. 23, 2009    (JP) .................................. 2009-104857

(51) Int. Cl.
*B23K 3/06* (2006.01)
(52) U.S. Cl. ................. 228/245; 228/248.1; 228/180.22; 438/612; 438/613; 438/614; 438/615
(58) Field of Classification Search .................. 228/245, 228/248.1, 180.22; 438/612–615
See application file for complete search history.

(56) References Cited

U.S. PATENT DOCUMENTS

| 6,011,629 | A  | * | 1/2000 | Ootake et al. ................. 356/400 |
| 2007/0130764 | A1 | * | 6/2007 | Nebashi et al. ................. 29/843 |
| 2010/0072259 | A1 | * | 3/2010 | Honma et al. ................... 228/41 |
| 2010/0272884 | A1 | * | 10/2010 | Igarashi et al. ............ 427/126.1 |

FOREIGN PATENT DOCUMENTS

| JP | 07202403 A | * | 8/1995 |
| JP | 2005-101502 | | 4/2005 |
| JP | 2008-142775 | | 6/2008 |

OTHER PUBLICATIONS

English computer translation JP 07202403 A.*
English Computer Translation JP07202403 date: Aug. 1995.*

* cited by examiner

*Primary Examiner* — Jessica L Ward
*Assistant Examiner* — Erin Saad
(74) *Attorney, Agent, or Firm* — Antonelli, Terry, Stout & Kraus, LLP.

(57) ABSTRACT

The present invention provides a solder ball printing apparatus in which solder balls are uniformly dispersed on a mask surface and are loaded into an opening area of the mask. A solder ball shaking and discharging unit includes a solder ball reception unit which receives solder balls from a solder ball reservoir unit, a wire member in a convex shape which is attached to surround a solder ball shaking and discharging port of the solder ball shaking and discharging unit and in which a plurality of wire members are arranged at predetermined intervals, and solder ball rotating and collecting mechanisms which sweep and collect the solder balls at the wire member in a convex shape.

17 Claims, 6 Drawing Sheets

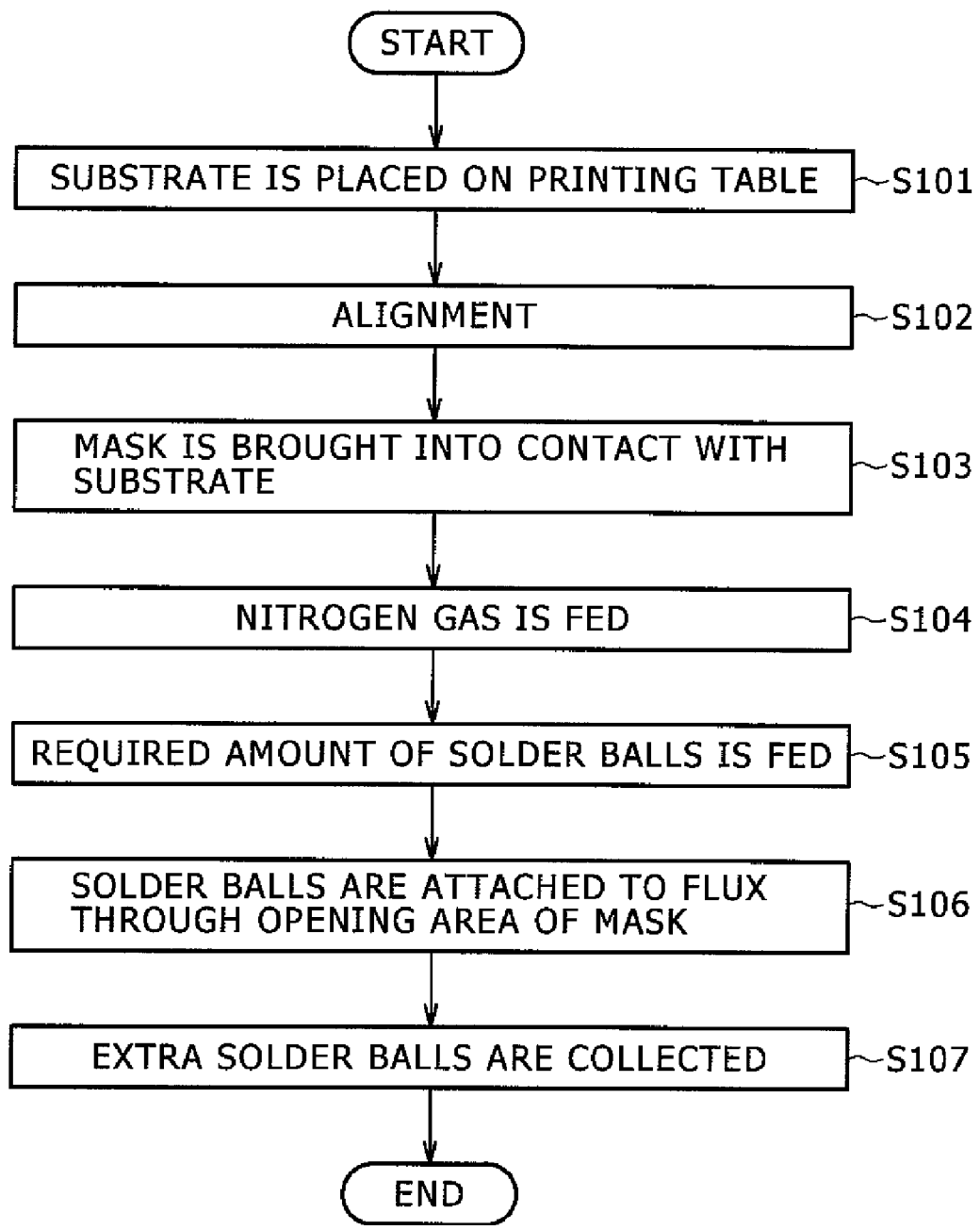

SOLDER BALL PRINTING APPARATUS

BACKGROUND OF THE INVENTION (1) Field of the Invention

The present invention relates to a printing apparatus for forming solder balls on an electrode of a substrate such as a semiconductor by a printing method, and particularly to a solder ball printing apparatus for printing using solder balls.

(2) Description of the Related Art

In a conventional solder ball printing apparatus, there have been proposed various configurations in which a mask used for printing solder balls is placed on a substrate such as a semiconductor, the solder balls are fed onto a mask surface, and the fed solder balls are pressed from an opening area provided at the mask into a surface of the substrate such as a semiconductor.

As described in, for example, Japanese Patent Application Laid-Open No. 2005-101502, there is disclosed a printing apparatus configured in such a manner that a solder ball feeding unit for feeding solder balls onto a mask surface and a plurality of wire members provided at a sieve are moved in the horizontal direction while being pressed into the mask surface in order to press the solder balls fed onto the mask surface into a surface of a substrate from an opening area provided at the mask.

In the printing apparatus, it is described that at a left end of the mask, there is provided a solder ball sucking port where the solder balls remaining on the mask surface are sucked and removed.

Further, Japanese Patent Application Laid-Open No. 2008-142775 discloses that when solder balls are squeezed into an opening area of a mask by moving a squeegee head in the horizontal direction while rotating the same, a predetermined amount of solder balls is fed to a rotational shaft portion of the squeegee head from a measuring unit provided at an upper portion of the squeegee head, and the solder balls are fed from the rotational shaft onto a mask surface.

In the configuration of Japanese Patent Application Laid-Open No. 2005-101502, when the mask is placed on a table, a solder ball feeding apparatus is disposed at an inlet port to which the mask is carried, and the mask is moved on the mask while feeding the solder balls onto the mask surface from the solder ball feeding apparatus.

Accordingly, the solder balls are uniformly dispersed and arranged on the mask surface. Thereafter, the sieve is moved in the horizontal direction, and the solder balls are fed into the opening area of the mask. When the solder balls are dispersed and arranged on the mask in this method, there is a risk that the dispersed and arranged solder balls vary in amount due to fluctuations caused when the mask is moved and oscillation when the movement of the mask stops.

Further, since the solder balls are fed before the mask is set in the printing apparatus, it is necessary to move the mask for each printing process, resulting in the problem of a long tact time.

Further, solder balls unused in printing are sucked through the sucking port provided separately from a solder ball feeding head. In this case, when the extra solder ball can not be held by the first wire member of the sieve in a wire shape, the extra solder ball is held by the subsequent wire member to be carried near the sucking port. However, there is a possibility that the solder ball held by the subsequent wire member and the solder ball which is previously fed are fed to an opening area of the mask at the same time.

In the method of feeding the solder balls onto the mask surface from the rotational shaft portion as disclosed in Japanese Patent Application Laid-Open No. 2008-142775, the solder balls are dispersed and arranged on the mask surface along with the rotation of the squeegee head. Accordingly, the solder balls can not be always uniformly dispersed and arranged, and printing defects are generated. Thus, a repairing step is essential.

As described above, when the solder balls are dispersed and arranged on the mask, there is a risk that the dispersed and arranged solder balls vary in amount due to fluctuations caused when the mask is moved and oscillation when the movement of the mask stops. In addition, since the solder balls are dispersed and arranged on the mask surface along with the rotation of the squeegee head, the solder balls can not be uniformly dispersed and arranged. Thus, there are problems in aspects of the configuration of the apparatus and printing methods.

Accordingly, a first object of the present invention is to provide a solder ball printing apparatus for uniformly printing solder balls with a high degree of accuracy.

A second object of the present invention is to provide a solder ball printing apparatus for shortening a tact time in solder ball printing.

A third object of the present invention is to provide a small-sized solder ball printing apparatus with a simple configuration.

A fourth object of the present invention is to provide a solder ball printing apparatus in which solder balls unloaded into an opening area of a mask are collected for reuse by solder ball rotating and collecting mechanisms.

A fifth object of the present invention is to provide a solder ball printing apparatus in which when solder balls are fed to a solder ball shaking and discharging unit from a solder ball reservoir unit, the solder balls are reliably fed to the solder ball shaking and discharging unit while preventing the solder balls from being spread around.

A sixth object of the present invention is to provide a solder ball printing apparatus which reduces a period of time when solder balls are exposed to the atmosphere to prevent the solder balls from being oxidized.

SUMMARY OF THE INVENTION

The present invention provides a solder ball printing apparatus which prints solder balls on a substrate and an electrode on the substrate through a mask, the apparatus including: a solder ball reservoir unit which reserves the solder balls; a solder ball shaking and discharging unit which is located under the solder ball reservoir unit, receives a predetermined amount of solder balls from the solder ball reservoir unit, and feeds the received solder balls onto a surface of the mask located on the substrate; a moving mechanical unit which moves the solder ball shaking and discharging unit along the substrate; and an oscillation unit which applies predetermined oscillation to the solder ball shaking and discharging unit, wherein the solder ball shaking and discharging unit includes a solder ball reception unit in a rectangular funnel shape for receiving the solder balls from the solder ball reservoir unit, a wire member in a convex shape for feeding and dispersing the received solder balls onto the surface of the mask located on the substrate, the wire member having a structure in which a plurality of wire members are arranged at predetermined intervals, and solder ball rotating and collecting mechanisms, each of which is located in the front and rear directions of the wire member in a convex shape to collect the solder balls which are dispersed without being loaded by the wire member in a convex shape near the wire member in a convex shape.

Further, the solder ball shaking and discharging unit forms a sealing-type head structure with a head ceiling plate and cover plates so as to cover the wire member in a convex shape and the solder ball rotating and collecting mechanisms, and is configured in such a manner that a wide opening area of the solder ball reception unit in a rectangular funnel shape is attached to the head ceiling plate.

In the above configuration, the solder ball shaking and discharging unit forms a sealing-type head structure with a head ceiling plate and cover plates so as to cover the solder ball loading member and the solder ball rotating and collecting mechanisms, and is configured in such a manner that a wide opening area of the solder ball reception unit in a rectangular funnel shape is attached to the head ceiling plate.

In the above configuration, the moving mechanical unit further includes a vertically-driving mechanism for vertically moving the solder ball shaking and discharging unit, applies pressing force to press the wire member in a convex shape provided at the solder ball shaking and discharging unit to the surface of the mask with the vertically-driving mechanism, and allows the wire member in a convex shape to be brought into contact with the surface of the mask with predetermined pressing force in the moving direction of the solder ball shaking and discharging unit.

In the above configuration, the wire member in a convex shape includes the plurality of wire members at predetermined intervals, the wire member is a steel plate with a thickness of 0.05 to 0.1 mm and a width of 0.1 mm, the intervals of the wire members are 0.1 mm to 0.3 mm, and the wire members are provided while being inclined at angles of about 5 to 35 degrees relative to the direction orthogonal to the travelling direction of the solder ball shaking and discharging unit.

Further, in the above configuration, the plurality of wire members of the solder ball loading member provided at the solder ball shaking and discharging unit are provided in such a manner that the inclined directions thereof are opposed to each other.

In the above configuration, the solder ball printing apparatus further includes: a printing table for fixing the substrate; a camera with two upper and lower viewing fields for recognizing an electrode pattern on the substrate on the printing table and an electrode pattern of the mask; a driving apparatus which drives and aligns the printing table on the basis of the result recognized by the camera with two viewing fields; and a driving mechanism for lifting the printing table to allow the substrate to be brought into contact with the mask.

The present invention is advantageous in that the solder balls can be uniformly fed onto the mask, the solder balls can be fed by replacing the solder ball reservoir unit with another or by feeding the solder balls to the solder ball reservoir unit from outside while checking the amount of remaining solder balls in the solder ball reservoir unit, and it is not necessary to interrupt an operation due to the deficiency and excess of the solder balls.

Further, since the wire member in a semi-spiral shape or the wire member in a convex shape provided at the solder ball shaking and discharging port is arranged, rotational force can be added to the solder balls by oscillation in a space formed by the wire member in a semi-spiral shape or the wire member in a convex shape. Thus, the solder balls can be uniformly dispersed and can be smoothly loaded even into the opening area of the mask. Further, since the extra solder balls remaining on the mask surface are collected for use near the wire member in a semi-spiral shape or the wire member in a convex shape by the solder ball rotating and collecting mechanisms, the solder balls can be effectively used.

BRIEF DESCRIPTION OF THE DRAWINGS

FIG. 6 is a flowchart for showing an embodiment of a solder ball printing method.

DETAILED DESCRIPTION OF THE EMBODIMENT

Hereinafter, the present invention will be described using the drawings. An embodiment described below is one aspect of the present invention, and can be amended and modified within a range where those skilled in the art can easily conceive.

First Embodiment

Figure 1A:
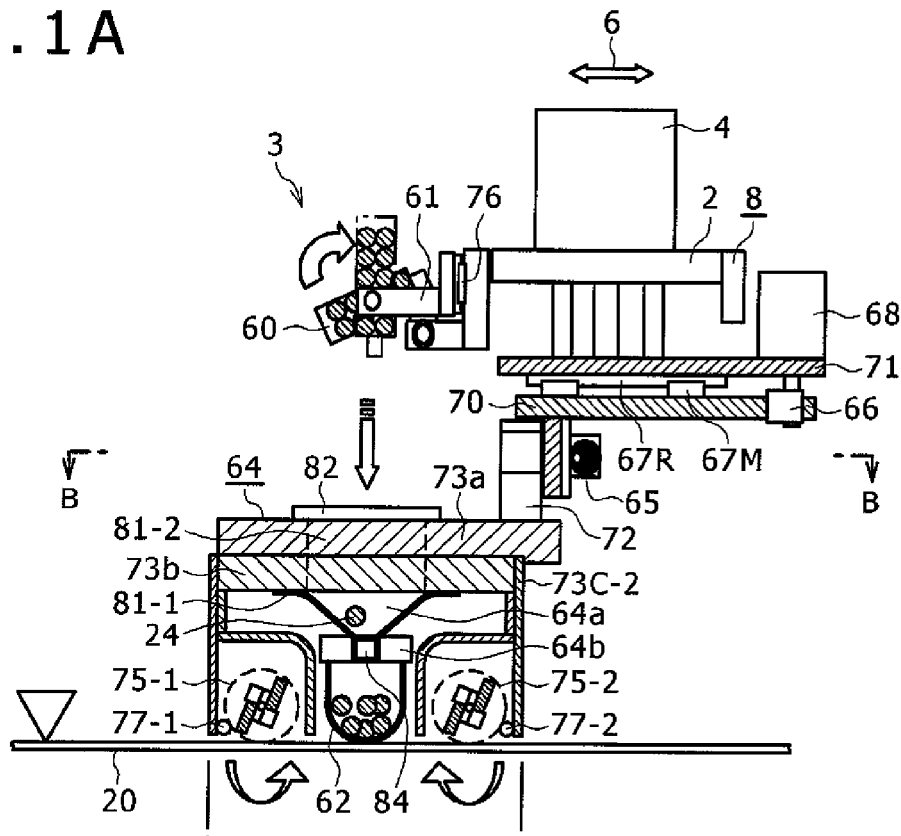
FIG. 1 are diagrams, each showing a schematic configuration of an embodiment of a solder ball feeding head for a solder ball printing apparatus.
Figure 1B:
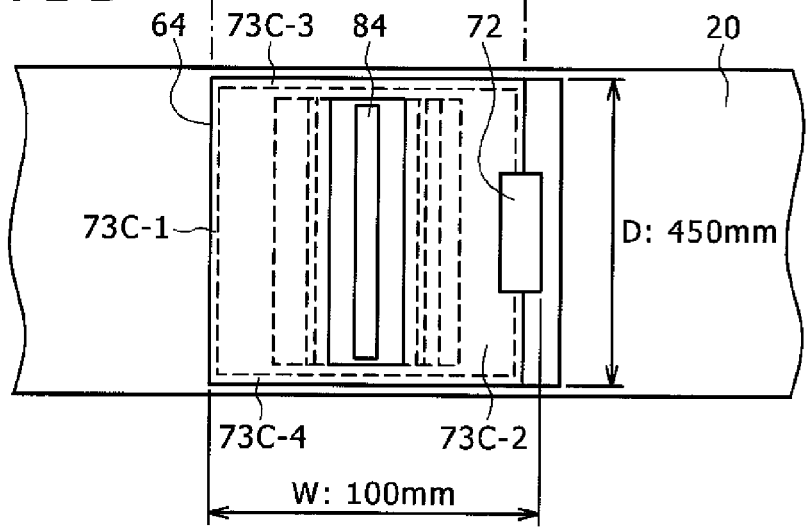
Figure 2A:
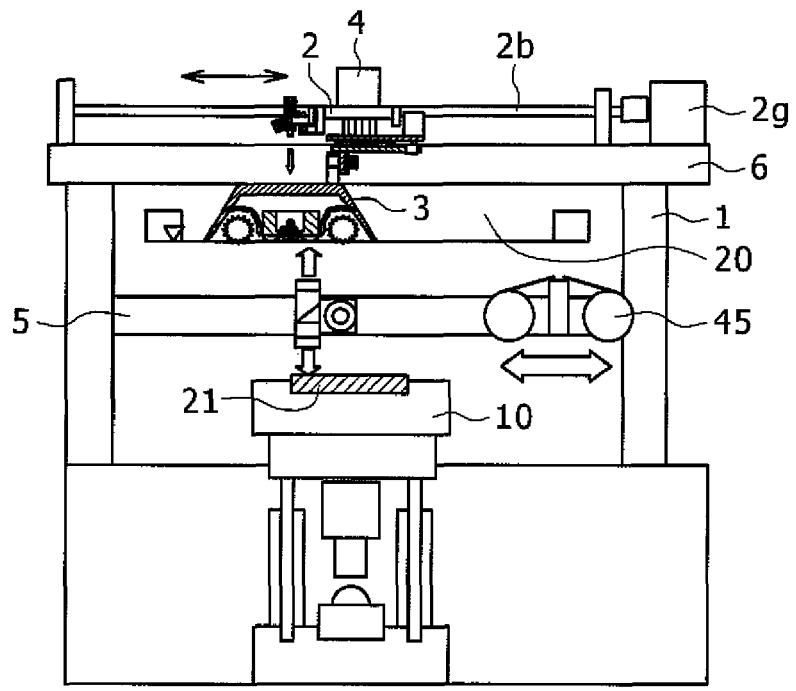
FIG. 2 are diagrams, each showing a schematic configuration of the solder ball printing apparatus for printing solder balls.
Figure 2B:
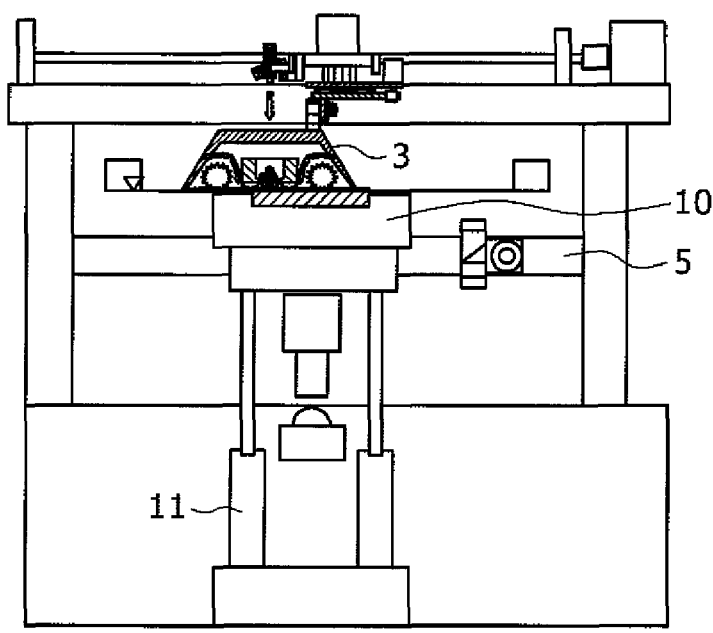

An embodiment of a solder ball printing apparatus according to the present invention will be described using FIG. 1 and FIG. 2. FIG. 1 are diagrams, each showing a schematic configuration of the embodiment of a solder ball feeding head for the solder ball printing apparatus of the present invention. FIG. 1A is a diagram for showing a schematic configuration of a side face of the solder ball feeding head for the solder ball printing apparatus according to the embodiment. FIG. 1B is a schematic plan view viewed from the line B-B in the solder ball feeding head for the solder ball printing apparatus of FIG. 1A. FIG. 2 are diagrams, each showing a schematic configuration of the embodiment of the solder ball printing apparatus in which a solder ball printing head is provided. FIG. 2A is a diagram for explaining a state in which a mask and a substrate are aligned, and FIG. 2B is a diagram for explaining a state in which solder balls are printed on the substrate.

In a solder ball printing apparatus 1 shown in FIG. 2, a solder ball feeding head 3 is movably attached to an attachment frame 6 and a ball screw 2b of the solder ball printing apparatus 1 through a head moving table 2. The solder ball feeding head 3 is configured in such a manner that the ball screw 2b is rotated by control of a motor 2g and the solder ball feeding head 3 is moved in the arrow directions. It should be noted that the details of the solder ball printing apparatus 1 will be described later.

In the first place, an embodiment of the solder ball feeding head 3 will be described using FIG. 1. The solder ball feeding head 3 shown in FIG. 1A includes a solder ball shaking and discharging unit 64, a moving mechanical unit 8 for moving the solder ball shaking and discharging unit 64, and a connection member 72 for connecting the solder ball shaking and discharging unit 64 and the moving mechanical unit 8. Further, in the solder ball feeding head 3, a solder ball feeding table 61 to which a solder ball reservoir unit 60 is attached is provided at the head moving table 2. In addition, the solder ball shaking and discharging unit 64 for feeding solder balls to a mask surface is arranged on the lower side relative to the solder ball reservoir unit 60. It should be noted that the positional relation between a mask surface 20 and the solder ball shaking and discharging unit 64 of the solder ball feeding head 3 is shown by the plan view of FIG. 1B. Further, the solder ball shaking and discharging unit 64 is formed in such a manner that the width thereof is substantially the same as or slightly shorter than the width (in the direction orthogonal to the travelling directions of the head) of the mask 20. In the plan view of FIG. 1B, the width of the solder ball shaking and discharging unit 64 is formed to be shorter than the width of the mask 20. The solder ball shaking and discharging unit 64 has, for example, a length W of about 100 mm in the travelling directions of the head and a width D of about 450 mm in the direction orthogonal to the travelling directions of the head, as shown in FIG. 1B.

Figure 3:
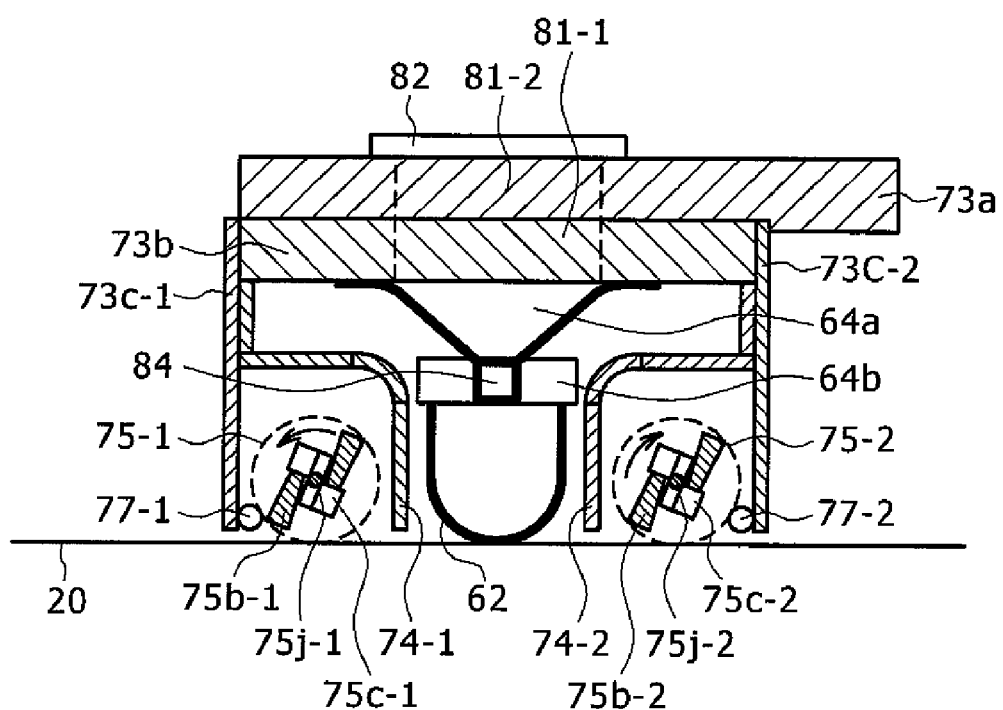
FIG. 3 is a diagram for showing details of an embodiment of a solder ball shaking and discharging unit for the solder ball printing apparatus.

The solder ball shaking and discharging unit 64 is structured to be surrounded by cover plates 73c-1, 73c-2, 73c-3, and 73c-4 and a head ceiling plate 73b, as shown in FIG. 1 (an enlarged view thereof is shown in FIG. 3). In the solder ball shaking and discharging unit 64, there are provided a solder ball reception unit 64a which receives solder balls 24 fed from the solder ball reservoir unit 60, a solder-ball-shaking-and-discharging-unit supporting member 64b, a wire member 62 (to be described later) in a semi-spiral shape or a convex shape which feeds the solder balls 24 fed from the solder ball reception unit 64a onto the surface of the mask 20 and loads the solder balls 24 into an opening area provided at the mask 20, a head supporting member 73a which supports the solder ball shaking and discharging unit 64, an opening and closing cover 82, solder ball rotating and collecting mechanisms 75-1 and 75-2 (the solder ball rotating and collecting mechanisms 75-1 and 75-2 are collectively referred to as the solder ball rotating and collecting mechanisms 75 in some cases), and partition covers 74-1 and 74-2 used for portioning between the solder ball rotating and collecting mechanisms 75 and the wire member 62 in a semi-spiral shape or a convex shape.

The solder ball reception unit 64a is attached to the inside of the head ceiling plate 73b by bolting. Further, the head supporting member 73a and the head ceiling plate 73b are provided with opening areas 81-2 and 81-1, respectively, so that the solder balls 24 from the solder ball reservoir unit 60 can be fed. The solder ball reception unit 64a is formed in a rectangular funnel shape as shown in FIG. 1B and FIG. 3. Specifically, the solder ball reception unit 64a is formed in a so-called rectangular funnel shape in which the size of the upper portion of the solder ball reception unit 64a is substantially equal to that of the opening area 81-1 of the head ceiling plate 73b, and the length of the solder ball reception unit 64a in the travelling direction of the solder ball shaking and discharging unit 64 becomes shorter towards the lower side.

The wide opening area of the solder ball reception unit 64a is attached to the head ceiling plate 73b by bolting and the narrow opening area thereof is connected to an opening area 84 provided at the solder-ball-shaking-and-discharging-unit supporting member 64b. By forming the solder ball reception unit 64a in such a rectangular funnel shape, the solder balls 24 fed from the solder ball reservoir unit 60 that is provided above the solder ball shaking and discharging unit 64 while being apart therefrom can be reliably received without being spread around the solder ball shaking and discharging unit 64.

Each of the narrow opening area of the solder ball reception unit 64a and the opening area 84 provided at the solder-ball-shaking-and-discharging-unit supporting member 64b is formed to be slightly larger than the size of one solder ball in the travelling directions of the head (arrow directions), and is formed to be shorter than the width D of the solder ball shaking and discharging unit 64 in the lateral direction of the head (the direction orthogonal to the travelling directions of the head). The size of the opening area 84, in the travelling directions of the head, provided at the solder-ball-shaking-and-discharging-unit supporting member 64b is formed in such a manner that two or more solder balls 24 can not be fed at the same time. For example, if the size of the solder ball 24 is 50 μm, the size of the opening area is set at about 70 μm that is slightly larger than 50 μm.

The wire member 62 in a semi-spiral shape or a convex shape is formed so as to cover the opening area 84 provided at the solder-ball-shaking-and-discharging-unit supporting member 64b. The wire member 62 in a semi-spiral shape or a convex shape uniformly shakes and drops the solder balls 24 onto the surface of the mask 20 by oscillation that is to be described later, and the solder balls 24 are loaded into the opening area of the mask.

Further, the opening and closing cover 82 is provided at the upper portion of the opening area 81-2. The opening and closing cover 82 has a so-called sealing-type head configuration in which the opening and closing cover 82 is closed except when the solder balls 24 are fed to the solder ball shaking and discharging unit 64 and the inside of the solder ball shaking and discharging unit 64 is sealed when the wire member 62 in a semi-spiral shape or a convex shape of the solder ball shaking and discharging unit 64 is brought into contact with the mask 20. As described above, by sealing the inside of the solder ball shaking and discharging unit 64, it is possible to prevent the solder balls 24 from being oxidized by the air. Further, it should be noted that in order to prevent oxidization, nitrogen gas feeding ports 77-1 and 77-2 are provided inside the solder ball shaking and discharging unit 64, and a nitrogen gas is introduced to the inside of the solder ball shaking and discharging unit 64. Accordingly, the oxidization of the solder balls 24 can be prevented and connection defects of the solder balls 24 can be reduced.

Next, the solder ball rotating and collecting mechanisms 75 will be described. The solder ball rotating and collecting mechanism 75-1 is disposed in a space surrounded by the cover plates 73c-1, 73c-3, and 73c-4 and the partition cover 74-1. In addition, the solder ball rotating and collecting mechanism 75-2 is disposed in a space surrounded by the cover plates 73c-2, 73c-3, and 73c-4 and the partition cover 74-2. The solder ball rotating and collecting mechanisms 75-1 and 75-2 include rotational shafts 75j-1 and 75j-2, brush attachment members 75c-1 and 75c-2 attached to these rotational shafts while sandwiching the same, and pairs of brushes 75b-1 and 75b-2 provided at these brush attachment members, respectively. It should be noted that the cover plates 73c-1, 73c-2, 73c-3, and 73c-4, the solder ball rotating and collecting mechanisms 75-1 and 75-2, the rotational shafts 75j-1 and 75j-2, the attachment members 75c-1 and 75c-2, the brushes 75b-1 and 75b-2, and the partition covers 74-1 and 74-2 are collectively referred to as the cover plates 73c, the solder ball rotating and collecting mechanisms 75, the rotational shafts 75j, the attachment members 75c, the brushes 75b, and the partition covers 74, respectively.

The solder ball rotating and collecting mechanisms 75 are configured to be rotated in the arrow directions. The solder balls 24 that are shaken and discharged from the wire member 62 in a semi-spiral shape or a convex shape are dispersed and spread on the mask 20. However, the rotation of the solder ball rotating and collecting mechanisms 75 allows the solder balls 24 to be collected around the wire member 62 in a semi-spiral shape or a convex shape, and the solder balls 24 are efficiently printed on an opening area 94 of the mask 20.

Further, the partition covers 74 prevent the solder balls 24 swept by the brushes 75b of the solder ball rotating and collecting mechanisms 75 from the surface of the mask 20 from being spread around, and the solder balls 24 can be reliably swept and collected towards the wire member 62 in a semi-spiral shape or a convex shape. Further, as driving sources for rotating and driving the rotational shafts 75j, there are provided driving motors (not shown) attached to upper portions of the head supporting member 73a at the both ends in the longitudinal direction. Between shafts of the driving motors and the rotational shafts 75j, there are configured belt mechanisms including pulleys and belts for transmitting driving force. The solder balls 24 swept and collected by the brushes 75b are accumulated in surrounding areas of the wire member 62 in a semi-spiral shape or a convex shape, and the solder ball shaking and discharging unit 64 is moved in the arrow direction, so that the solder balls 24 are used as solder balls to be loaded.

Next, the moving mechanical unit 8 will be described. The moving mechanical unit 8 includes a head attachment frame 71 attached to the connection member 72, the head moving table 2, a head vertically-moving mechanism 4, a solder ball feeding table 61 coupled to the head moving table 2, and the solder ball reservoir unit 60. The head vertically-moving mechanism 4 includes cylinders and pistons, and is attached to the head moving table 2. Further, the head attachment frame 71 is attached to piston shafts of the vertically-moving mechanism 4. Accordingly, the vertical movement of the piston shafts allows the solder ball shaking and discharging unit 64 connected to the head attachment frame 71 through the connection member 72 to be vertically moved. The piston shafts are moved downward when the solder ball shaking and discharging unit 64 is brought into contact with the mask 20 to print the solder balls on the substrate through the mask 20, and are moved upward when the solder ball shaking and discharging unit 64 is returned to its original position (for example, home position) after completion of the print. Further, the head moving table 2 is connected to the ball screw portion of a horizontally-moving mechanism including the motor 2g and the ball screw 2b provided on the side of the main body of the apparatus as described above, and is moved in the horizontal direction by driving the motor 2g.

Further, the solder ball feeding table 61 to which the solder ball reservoir unit 60 is attached is provided at the head moving table 2. The solder ball reservoir unit 60 is attached to the solder ball feeding table 61 so as to be rotated in the arrow direction. In addition, the solder ball reservoir unit 60 can be vertically moved by a linear driving unit 76. When the solder balls 24 are fed to the solder ball shaking and discharging unit 64, the solder ball reservoir unit 60 is moved downward and is rotated to allow an opening area of the solder ball reservoir unit 60 to face downward. Accordingly, the solder balls 24 can be shaken and dropped into the solder ball reception unit 64a from the inside of a container (cylinder) configuring the solder ball reservoir unit 60 through the opening area 81-1 of the head ceiling plate 73b and the opening area 81-2 of the head supporting member 73a.

Further, the solder ball feeding table 61 to which the solder ball reservoir unit 60 is attached can be moved in the direction (referred to as a longitudinal direction) orthogonal to the travelling direction of the solder ball shaking and discharging unit 64 by the linear driving unit 76. When the solder balls 24 are fed to the solder ball reception unit 64a, the solder ball reservoir unit 60 is moved in the longitudinal direction to uniformly feed the solder balls 24 in the longitudinal direction of the solder ball reception unit 64a.

Further, the solder balls used in one printing process are initially and preliminarily fed to the solder ball reception unit 64a of the solder ball shaking and discharging unit 64. Specifically, the solder ball shaking and discharging unit 64 is moved in the arrow direction as shown in FIG. 1A to shake and discharge the solder balls 24 onto the mask 20 in accordance with the movement. For example, if the movement of the solder ball feeding head 3 from the right end to the left end is assumed as one stroke in the solder ball printing apparatus of FIG. 2, it is necessary to feed the solder balls 24 enough to be fed onto the mask 20 in one stroke to the solder ball reception unit 64a. This corresponds to, for example, solder ball feeding for one printing process. The solder balls used in one printing process mean the amount of solder balls necessary in one stroke when the solder balls are fed onto the surface of the mask, and mean that the solder balls are fed to the solder ball reception unit 64a by preliminarily estimating the amount. However, it is difficult to accurately estimate the amount. Accordingly, when the amount of solder balls is not enough, the solder balls corresponding to the deficiency are appropriately refilled from the solder ball reservoir unit 60. When the amount of solder balls is large, the extra solder balls are collected.

It should be noted in the embodiment that the diameter of the solder ball to be printed is substantially equal to the size of the opening area of the mask, and the solder ball with a diameter of 20 μm to 80 μm can be used. For example, if the opening area of the mask 20 is 50 μm in size, the solder ball with a diameter slightly smaller than 50 μm is used for printing. It should be noted in the embodiment that the embodiment will be described using the solder ball with a diameter of 20 μm to 80 μm, but the present invention is not limited thereto.

Further, the opening area 94 of the mask shown in FIG. 5 to be described later is slightly larger than the diameter of the solder ball 24 so as to fit the solder ball 24. In addition, the size of the solder ball shaking and discharging port 84 is substantially equal to that of the opening area 94 of the mask, and is slightly larger than that of the solder ball 24, which prevents an excessive amount of solder balls 24 from being discharged from the solder ball shaking and feeding port 84 at a time.

Here, the solder ball shaking and discharging unit 64 will be described in more detail. The solder ball shaking and discharging unit 64 has an oscillation structure in which predetermined oscillation is applied so as to substantially uniformly shake and discharge the solder balls 24 onto the mask 20. The oscillation structure will be described in detail. The connection member 72 is attached to an oscillation frame 70. An oscillator 65 is provided at the oscillation frame 70 so that the solder ball shaking and discharging unit 64 is oscillated in the front and back directions of the travelling direction of the solder ball shaking and discharging unit 64 at a high frequency of, for example, about 220 to 250 Hz. Further, a slider 67M is provided at an upper portion of the oscillation frame 70. The slider 67M is attached to a linear guide 67R provided at the head attachment frame 71 provided above the oscillation frame. A cam 66 is provided at one end of the oscillation frame 70, and is rotated and driven by a cam shaft driving motor 68 provided at the head attachment frame 71, so that the oscillation frame 70 is vibrated in the horizontal direction (towards the linear guide) at a frequency of, for example, about 1 to 10 Hz which is lower than the above-described frequency of the oscillator 65.

As described above, by providing two different oscillation units, the frequencies at which the solder ball shaking and discharging unit 64 is oscillated can be selected in a wide range, and the solder balls to be shaken and discharged by oscillation from the wire member 62 in a semi-spiral shape or a convex shape which is provided so as to cover the solder ball shaking and discharging port 84 can be effectively fed to the surface of the mask from the solder ball reception unit 64a.

Further, a valve (not shown) is provided at the solder ball shaking and discharging port 84 of the solder-ball-shaking-and-discharging-unit supporting member 64b to prevent the extra solder balls 24 from being dropped into the wire member 62 in a semi-spiral shape or a convex shape. For example, this valve is opened and closed by rotating a cover state (shutter) with a damper mechanism by 90 degrees.

Figure 5:
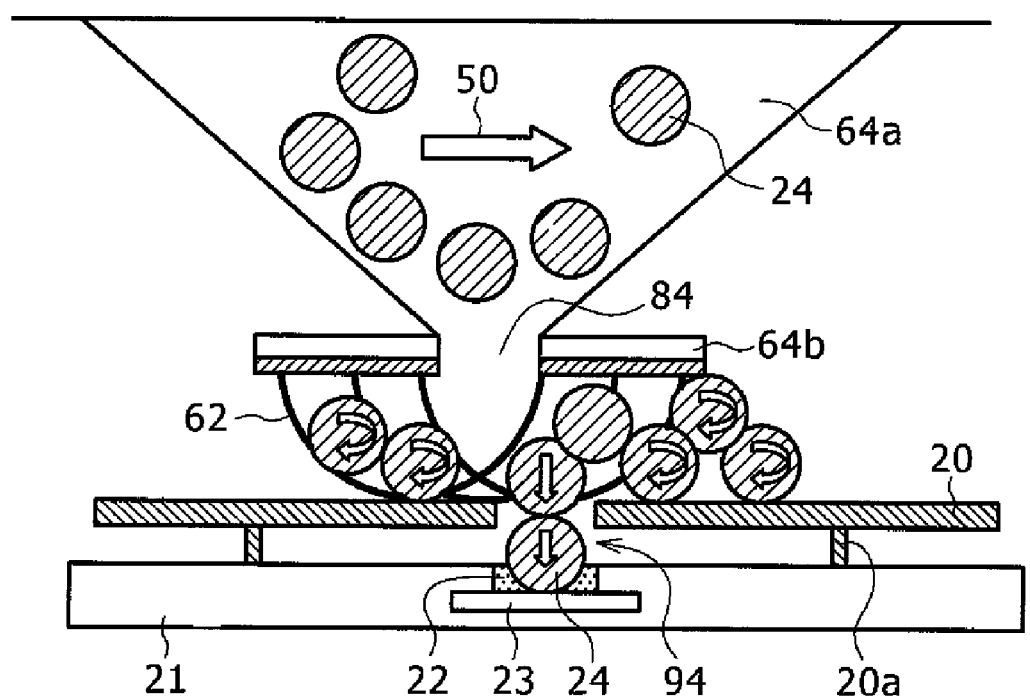
FIG. 5 is a diagram for explaining an operation of loading the solder balls.

FIG. 5 shows an enlarged view of a part of the solder ball shaking and discharging unit 64. A state in which the solder balls 24 are printed will be described in detail using FIG. 5.

In FIG. 5, a flux 22 is preliminarily printed at an electrode portion 23 on the substrate 21. In addition, minute projections 20a are provided on the rear surface side of the mask 20 near the opening area 94 to prevent the mask 20 from being directly brought into contact with the flux. In place of the minute projections 20a, minute steps such as films may be provided. Further, as shown in FIG. 5, the wire member 62 in a semi-spiral shape or a convex shape is attached near the solder ball shaking and discharging port 84 of the solder ball shaking and discharging unit 64 so as to cover the solder ball shaking and discharging port 84.

The wire member 62 in a semi-spiral shape or a convex shape is brought into contact with the mask 20 in a slightly deformed state because the solder ball shaking and discharging unit 64 is pressed by the vertically-moving mechanism 4 to the extent that the solder ball shaking and discharging unit 64 is brought into contact with the mask 20 with predetermined pressing force. Here, the slightly deformed state of the wire member 62 in a semi-spiral shape or a convex shape is referred to as a state of a substantially spiral shape (or a substantially semicircular shape). It is obvious that the state of a substantially spiral shape (or a substantially semicircular shape) is determined in such a manner that the solder ball printing apparatus of the present invention is experimentally operated in advance, the pressing force is adjusted so as to substantially uniformly shake and discharge the solder balls 24 from the opening area 84 of the solder ball reception unit 64a onto the mask 20, and the oscillation frequency is selected.

Next, there will be described an operation of substantially uniformly shaking and discharging the solder balls 24 from the opening area 84 of the solder ball reception unit 64a onto the mask 20. In the wire member 62 in a semi-spiral shape or a convex shape provided near the solder ball shaking and discharging port 84 of the solder ball reception unit 64a, a space in a substantially spiral shape (or a substantially semicircular shape) is formed in the vertical direction, and the rotational force of the solder balls 24 is generated in the space in accordance with the traveling directions of the head as shown in the drawing. The rotational force of the solder balls 24 is generated by frictional force between the solder balls 24 and the wire member 62 in a semi-spiral shape or a convex shape and between the solder balls 24 and the mask 20. However, the vibration operation for oscillating the solder ball shaking and discharging unit 64 efficiently generates the rotational force as described above. Further, the oscillator 65 shown in FIG. 1 is advantageous in that minor vibration is applied to the balls, the dispersion of the balls and adhesion between the balls by the van der Waals force are avoided, and the solder balls 24 are efficiently shaken and discharged onto the mask 20. Accordingly, the solder balls 24 are dispersed, and one solder ball 24 is fed into one opening area 94 of the mask.

It should be noted that although the detail of the wire member 62 in a semi-spiral shape or a convex shape will be described later, each of intervals of wire members configuring the wire member 62 in a semi-spiral shape or a convex shape is smaller than the diameter of the solder ball 24 to be used by about 5 μm. As described above, setting the respective intervals smaller than the diameter of the solder ball 24 to be used by about 5 μm is advantageous in preventing many solder balls from being dropped onto the mask at a time, and the solder balls 24 can be uniformly shaken and dropped onto the mask 20. It should be noted that even if each of the intervals of the wire members configuring the wire member 62 in a semi-spiral shape or a convex shape is smaller than the diameter of the solder balls 24 by about 5 μm, the rotation of the solder balls 24 allows the solder balls 24 to slip through the intervals of the wire members and the solder balls are fed onto the mask 20.

Next, the embodiment of the solder ball printing apparatus will be described in more detail using FIG. 2. As shown in FIG. 2A, the solder ball printing apparatus 1 includes a printing table 10 on which the substrate 21 for printing the solder balls 24 is placed and a driving unit 11 for driving the printing table 10 to be vertically moved. The substrate 21 placed on the printing table 10 and the surface of the mask 20 are aligned using a camera 15 by driving an XY table (not shown) that is a horizontally-moving mechanism provided under the printing table 10. Specifically, the camera 15 images, for example, an alignment mark provided at the substrate 21 and an alignment mark provided at the mask 20 at the same time, and the XY table is moved so as to match the marks of the images for alignment.

Thereafter, the camera 15 for alignment is withdrawn, and the printing table 10 is lifted to allow the surface of the mask 20 provided on the upper portion of the table to be brought into contact with the surface of the substrate 21 as shown in FIG. 2B. Then, the head vertically-driving mechanism 4 is driven to allow the wire member 62 in a semi-spiral shape or a convex shape for feeding the solder balls to be brought into contact with the surface of the mask by vertically moving the ball feeding head 3. As described above, the pressing force is generated at the wire member 62 by the head vertically-driving mechanism 4, and a so-called printing pressure by which the solder balls 24 are pressed into the opening area 94 of the mask is accordingly generated.

Then, the ball screw 2b is rotated by driving the head driving unit 2g to move the solder ball feeding head 3 in the horizontal directions (arrow directions). When the solder ball feeding head 3 is being moved, the solder ball shaking and discharging unit 64 is oscillated in the horizontal direction (head moving direction) by the oscillator 65. At the same time, the cam 66 is also oscillated in the horizontal direction by driving and rotating the cam shaft driving motor 68, and the solder balls 24 in the wire member 62 in a semi-spiral shape or a convex shape are effectively shaken and discharged.

It should be noted that although it is described in the embodiment that the oscillator 65 and the cam 66 are driven at the same time to shake and discharge the solder balls 24, the solder balls may be shaken and discharged by driving one of the oscillator 65 and the cam 66. Further, at the same time as shaking and discharging of the solder balls, the solder balls are loaded into the opening area provided at the mask 20 by the wire member 62 in a semi-spiral shape or a convex shape of the solder ball shaking and discharging unit 64.

Further, a cleaning mechanism 45 for cleaning the rear surface of the mask is provided at a camera moving frame in the apparatus. The cleaning mechanism 45 cleans the mask while moving in the horizontal direction as similar to the camera 15. The cleaning mechanism 45 allows a sucking nozzle via a roll-to-roll clean wiper to be brought into contact with and moved to the rear surface of the mask for cleaning the mask.

Next, the wire member 62 in a semi-spiral shape or a convex shape provided near the solder ball shaking and discharging port 84 of the solder ball reception unit 64*a* will be described in detail using FIG. 4. It should be noted that for the wire member 62 in a semi-spiral shape or a convex shape, for example, the wire member 62 in a semi-spiral shape will be described in detail in FIG. 4. However, the configuration similar to this may be configured by the wire member in a convex shape.

Figure 4A:
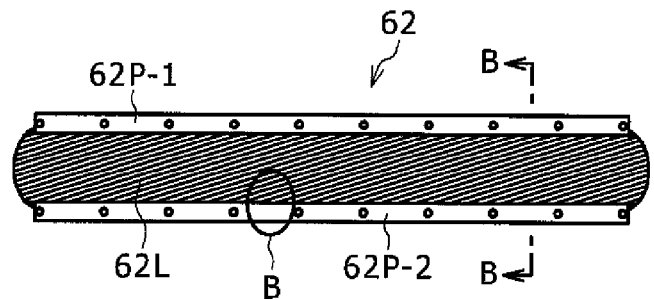
FIG. 4 are diagrams, each showing an embodiment of a wire member in a semi-spiral shape used for the solder ball shaking and discharging unit.
Figure 4B:
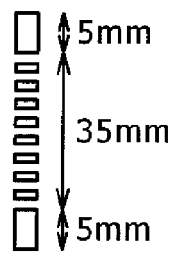
Figure 4C:
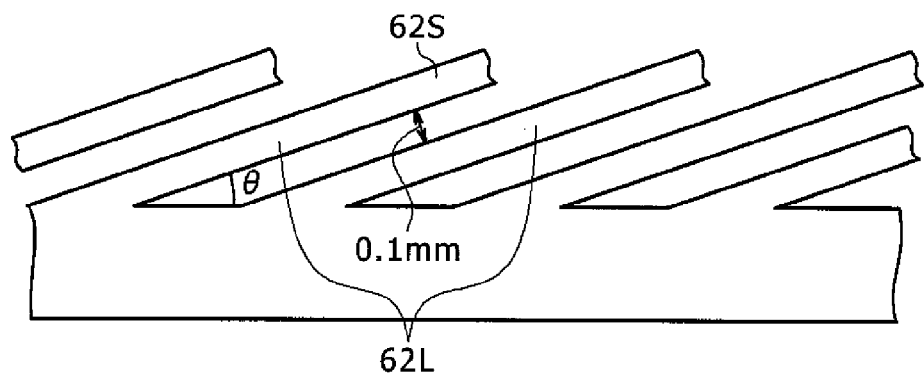
Figure 4D:
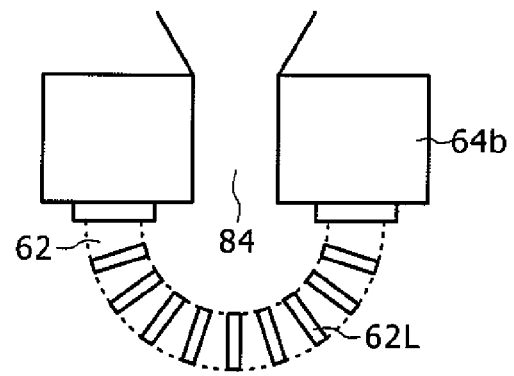

FIG. 4A is a plan view for showing a state before the wire member 62 in a semi-spiral shape is attached to the supporting member 64*b* of the solder ball shaking and discharging unit 64, FIG. 4B is a diagram for showing a cross section taken along the line B-B in FIG. 4A, and FIG. 4C is an enlarged view of a portion B in FIG. 4A. FIG. 4D is a cross-sectional view in a state where the wire member 62 in a semi-spiral shape is bent in a convex shape, and is attached near the solder ball shaking and discharging port 84 of the solder ball reception unit 64*a*.

In FIG. 4A, the wire member 62 in a semi-spiral shape includes two attachment portions 62P-1 and 62P-2 (the width of each attachment portion is about 5 mm, and the attachment portions 62P-1 and 62P-2 are collectively referred to as attachment portions 62P in some cases) which are provided in parallel at a predetermined interval (about 35 mm in the embodiment) and a plurality of wire members 62L with predetermined angles relative to the attachment portions 62P between the attachment portions 62P, as shown in the drawing. In more detail, the wire member 62 in a semi-spiral shape includes the attachment portions 62P and the plurality of wire members 62L with predetermined angles θ of, for example, about 5 to 35 degrees, preferably, about 10 degrees relative to the attachment portions 62P, as shown in FIG. 4C. The thickness of each wire member 62L is, for example, about 0.1 mm, and the wire members 62L are formed at predetermined intervals 62S of, for example, about 0.1 mm to 0.3 mm. It should be noted that each dimension shown in the embodiment is an example, and the embodiment is not limited to this. For example, the width of each predetermined interval 62S of about 0.1 mm is changed due to the diameter of the solder ball in some cases. However, it has been experimentally confirmed that the width of each predetermined interval 62S of about 0.1 mm can be used for the solder ball with a diameter of 20 to 80 μm.

Further, the embodiment is described using the wire member 62 in a semi-spiral shape. This is because if the planar wire member 62 in a semi-spiral shape as shown in FIG. 4A is bent to be attached to the supporting member 64*b* of the solder ball shaking and discharging unit 64 as shown in FIG. 4D, the wire members 62L become a semi-spiral shape. However, the embodiment is not limited to the wire member 62 in a semi-spiral shape, but the wire member 62 in a convex shape may be used. Thus, the wire member 62 in a convex shape includes the wire member 62 in a semi-spiral shape.

Next, a producing method of the wire member 62 in a semi-spiral shape will be described. The wire member 62 in a semi-spiral shape is formed in a shape as shown in FIG. 4A by etching a steel plate with a thickness of 0.1 mm through a mask in a predetermined shape.

Accordingly, the length of the wire member 62 in a semi-spiral shape is substantially equal to or slightly shorter than the width of the solder ball feeding head 3. The wire member 62 in a semi-spiral shape is attached across the solder ball shaking and discharging port 84 of the solder ball shaking and discharging unit 64. Specifically, the wire member 62 is attached in such a shape that the upper half portion of a spiral coil is cut off in the vertical direction of the solder ball feeding head. The wire member 62 is formed while being bent as shown in FIG. 4D, as an example.

Further, the head attachment frame 71 can be vertically moved by a motor 4 as a driving unit. It should be noted that although it is described in the embodiment that the head attachment frame 71 is vertically driven by the motor 4, a pneumatic cylinder may be used in place of the motor 4.

Next, a series of operations of printing the solder balls will be described using FIG. 6.

In the first place, the substrate 21, for example, a semiconductor wafer 21 (which is referred to as the substrate 21 in the following description) on which a flux 22 is printed at the electrode portion 23 is carried into the solder ball printing apparatus to be placed on the printing table 10 (step S101). A plurality of adsorption ports for feeding negative pressures are provided at the printing table 10, and the substrate 21 is retained so as not to move on the surface of the printing table by feeding negative pressures to the printing table 10.

Next, the alignment mark provided at the surface of the substrate 21 and the alignment mark provided at the mask 20 are imaged using the camera 15 for alignment. The imaged data are transmitted to a controlling unit (not shown) where image processing is performed to obtain misalignment. On the basis of the result, the printing table is moved by the horizontally-moving mechanism (not shown) in the direction where the misalignment is corrected (step S102).

When the alignment is completed, the printing table 10 is lifted, and the printing surface of the wafer 21 is brought into contact with the rear surface of the mask 20 (step S103).

Next, the solder ball feeding head 3 is horizontally moved to a print starting position, and then, is lowered on the surface of the mask, so that a predetermined printing pressure (pressing force) is applied to the surface of the mask. Next, a nitrogen gas is fed into the inside of the head from the nitrogen gas feeding ports 77, and the inside of the head becomes a nitrogen atmosphere (step S104). It should be noted that in the case where a nitrogen gas is not fed in the printing method, the step S104 is not necessary. Thereafter, the amount of solder balls in the solder ball shaking and discharging unit 64 is checked. In the case where the amount is not enough to be required for printing, the solder ball reservoir unit 60 is operated to feed the required amount of solder balls to the solder ball shaking and discharging unit 64 (step S105).

Thereafter, the oscillator 65 and the cam shaft driving motor 68 are driven to feed the solder balls 24 accommodated in the solder ball reception unit 64*a* onto the surface of the mask from the solder ball shaking and discharging port 84 provided at the solder-ball-shaking-and-discharging-unit supporting member 64*b* through the wire member 62 in a convex shape.

While the solder ball feeding head 3 is moved in the horizontal direction, the solder balls 24 shaken and discharged from the wire member 62 are pressed into the opening area 94 of the mask by the wire member 62 in a convex shape to be attached to the flux 22 on the substrate 21 (step S106). At this time, the solder balls 24 which are not pressed into the opening area 94 of the mask, namely, the extra solder balls are swept and collected towards the wire member 62 by driving the brushes 75 of the solder ball rotating and collecting mechanical units 75 through the rotational shafts 75*j*, so that the extra solder balls are pressed into the opening area 94 of the mask again, and are prevented from being leaked outside from the inside of the solder ball shaking and discharging unit 64.

When the movement of the solder ball feeding head 3 on the surface of the mask is finished, the solder ball feeding head 3 stops once to collect the extra solder balls 24 (step S107). Next, the solder ball feeding head 3 is lifted so as to be apart from the surface of the mask 20, and then, is returned to its original position (home position).

Next, the printing table 10 is lowered, and the mask is apart from the printing table. A printed state of the printed substrate 21 is imaged by the camera 15 to check the presence or absence of defects. If defects are present, the substrate is carried to a repairing unit to repair the defect portions. The substrate 21 is carried to a reflowing unit after the defect portions are repaired, and the solder balls 24 are melted to be fixed to the electrode portion 23.

The steps of the printing method of solder balls have been roughly described above, and the repairing method of the defect portions and the reflowing method after the defect portions are repaired after the step S107 have been well known from the past. Thus, the detailed explanations thereof are omitted in this specification.

As described above, it is possible to reliably feed the solder balls with minute diameters onto the flux of the substrate one by one from the opening area of the mask by using the solder ball printing apparatus of the present invention.

The embodiment has been described in detail above. However, it is obvious that the present invention is not limited to the embodiment of the solder ball printing apparatus and the solder ball printing method described herein, but can be easily applied to another solder ball printing apparatus and another solder ball printing method.

What is claimed is:

1. A solder ball printing apparatus configured to print solder balls on a substrate and an electrode on the substrate through a mask, the apparatus comprising:
   a solder ball reservoir unit configured to reserve the solder balls;
   a solder ball shaking and discharging unit located under the solder ball reservoir unit, that is configured to receive a predetermined amount of solder balls from the solder ball reservoir unit, and feed the received solder balls onto a surface of the mask located on the substrate, wherein the solder ball shaking and discharging unit includes:
      a solder ball reception unit in a rectangular funnel shape configured to receive the solder balls from the solder ball reservoir unit,
      a convex-shaped wire member configured to feed and disperse the received solder balls onto the surface of the mask located on the substrate, the wire member having a plurality of wire sub-members arranged at predetermined intervals, and
      a plurality of solder ball rotating and collecting mechanisms, each being located either in a front direction or rear directions of the wire member, each including at least one driving brush and a rotational shaft, and each being configured such that solder balls which are not pressed into an opening area of the mask are swept and collected towards the wire member by driving the at least one brush within the rotational shaft;
   wherein the solder ball shaking and discharging unit is formed in such a manner that the width thereof is substantially the same as or shorter than the width of the mask, in a direction orthogonal to the traveling directions of the solder ball shaking and discharging unit;
   an oscillation unit configured to apply a predetermined oscillation to the solder ball shaking and discharging unit; and
   a moving mechanical unit configured to move the solder ball shaking and discharging unit along the substrate;
   wherein when solder balls are fed to the solder ball reception unit, the moving mechanical unit moves the soldier ball reservoir unit in a longitudinal direction, in order to uniformly feed solder balls in a longitudinal direction of the solder ball reception unit.

2. The solder ball printing apparatus according to claim 1, wherein the solder ball shaking and discharging unit forms a sealing-type head structure with a head ceiling plate and cover plates so as to cover the wire member and the solder ball rotating and collecting mechanisms, and is configured in such a manner that a wide opening area of the solder ball reception unit in a rectangular funnel shape is attached to the head ceiling plate.

3. The solder ball printing apparatus according to claim 2, wherein the moving mechanical unit further includes a vertically-driving mechanism configured to vertically move the solder ball shaking and discharging unit, applies a pressing force to press the wire member provided at the solder ball shaking and discharging unit to the surface of the mask with the vertically-driving mechanism, and allows the wire member to be brought into contact with the surface of the mask with predetermined pressing force in a moving direction of the solder ball shaking and discharging unit.

4. The solder ball printing apparatus according to claim 1, wherein the wire member includes the plurality of wire sub-members at predetermined intervals, the wire member is constructed from a steel plate with a thickness of 0.05 to 0.1 mm and a width of 0.1 mm, the intervals of the wire sub-members are 0.1 mm to 0.3 mm, and the wire members are provided while being inclined at angles of about 5 to 35 degrees relative to the direction orthogonal to the traveling direction of the solder ball shaking and discharging unit.

5. The solder ball printing apparatus according to claim 1, further comprising:
   a printing table configured to fix the substrate;
   a camera with an upper viewing field and a lower viewing field configured to recognize an electrode pattern on the substrate on the printing table and an electrode pattern of the mask;
   a driving apparatus configured to drive and align the printing table on the basis of the result recognized by the camera; and
   a driving mechanism configured to lift the printing table to allow the substrate to be brought into contact with the mask.

6. The solder ball printing apparatus according to claim 2, further comprising:
   a printing table configured to fix the substrate;
   a camera with an upper viewing field and a lower viewing field configured to recognize an electrode pattern on the substrate on the printing table and an electrode pattern of the mask;
   a driving apparatus configured to drive and align the printing table on the basis of the result recognized by the camera; and a driving mechanism configured to lift the printing table to allow the substrate to be brought into contact with the mask.

7. The solder ball printing apparatus according to claim 3, further comprising:
   a printing table configured to fix the substrate;
   a camera with an upper viewing field and a lower viewing field configured to recognize an electrode pattern on the substrate on the printing table and an electrode pattern of the mask;
   a driving apparatus configured to drive and align the printing table on the basis of the result recognized by the camera; and
   a driving mechanism configured to lift the printing table to allow the substrate to be brought into contact with the mask.

8. The solder ball printing apparatus according to claim 4, further comprising:
   a printing table configured to fix the substrate;
   a camera with an upper viewing field and a lower viewing field configured to recognize an electrode pattern on the substrate on the printing table and an electrode pattern of the mask;
   a driving apparatus configured to drive and align the printing table on the basis of the result recognized by the camera; and
   a driving mechanism configured to lift the printing table to allow the substrate to be brought into contact with the mask.

9. A solder ball printing apparatus for printing solder balls on a substrate and an electrode on the substrate through a mask, the apparatus comprising:
   a solder ball reservoir means for reserving the solder balls;
   a solder ball shaking and discharging means located under the solder ball reservoir means, for receiving a predetermined amount of solder balls from the solder ball reservoir means, and for feeding the received solder balls onto a surface of the mask located on the substrate, wherein the solder ball shaking and discharging means includes:
      a solder ball reception means in a rectangular funnel shape for receiving the solder balls from the solder ball reservoir means,
      a convex-shaped wire member for feeding and dispersing the received solder balls onto the surface of the mask located on the substrate, the wire member having a plurality of wire sub-members arranged at predetermined intervals, and
      a plurality of solder ball rotating and collecting means, each of which is located in either the front or rear directions of the wire member, in order to collect solder balls that have been dispersed without being loaded by the wire member,
      wherein the solder ball shaking and discharging means is formed in such a manner that the width thereof is substantially the same as or shorter than the width of the mask, in a direction orthogonal to the traveling directions of the solder ball shaking and discharging means;
   an oscillation means for applying a predetermined oscillation to the solder ball shaking and discharging means; and
   a moving mechanical means for moving the solder ball shaking and discharging means along the substrate;
   wherein when solder balls are fed to the solder ball reception means, the moving mechanical means moves the soldier ball reservoir means in a longitudinal direction, in order to uniformly feed solder balls in a longitudinal direction of the solder ball reception means.

10. The solder ball printing apparatus according to claim 9, wherein the solder ball shaking and discharging means forms a sealing-type head structure with a head ceiling plate and cover plates so as to cover the wire member and the solder ball rotating and collecting means, and is configured in such a manner that a wide opening area of the solder ball reception means in a rectangular funnel shape is attached to the head ceiling plate.

11. The solder ball printing apparatus according to claim 10,
   wherein the moving mechanical means further includes a vertically-driving means for vertically moving the solder ball shaking and discharging means, applying a pressing force to press the wire member provided at the solder ball shaking and discharging means to the surface of the mask with the vertically-driving means, and allowing the wire member to be brought into contact with the surface of the mask with a predetermined pressing force in a moving direction of the solder ball shaking and discharging means.

12. The solder ball printing apparatus according to claim 9, wherein the wire member includes the plurality of wire sub-members at predetermined intervals, the wire member is constructed from a steel plate with a thickness of 0.05 to 0.1 mm and a width of 0.1 mm, the intervals of the wire sub-members are 0.1 mm to 0.3 mm, and the wire members are provided while being inclined at angles of about 5 to 35 degrees relative to the direction orthogonal to the traveling direction of the solder ball shaking and discharging means.

13. The solder ball printing apparatus according to claim 9, further comprising:
   a printing table for fixing the substrate;
   a camera with an upper viewing field and a lower viewing field for recognizing an electrode pattern on the substrate on the printing table and an electrode pattern of the mask;
   a driving apparatus for driving and aligning the printing table on the basis of the result recognized by the camera; and
   a driving means for lifting the printing table to allow the substrate to be brought into contact with the mask.

14. The solder ball printing apparatus according to claim 10, further comprising:
   a printing table for fix the substrate;
   a camera with an upper viewing field and a lower viewing field for recognizing an electrode pattern on the substrate on the printing table and an electrode pattern of the mask;
   a driving apparatus for driving and aligning the printing table on the basis of the result recognized by the camera; and
   a driving means for lifting the printing table to allow the substrate to be brought into contact with the mask.

15. The solder ball printing apparatus according to claim 11, further comprising:
   a printing table for fixing the substrate;
   a camera with an upper viewing field and a lower viewing field for recognizing an electrode pattern on the substrate on the printing table and an electrode pattern of the mask;
   a driving apparatus for driving and aligning the printing table on the basis of the result recognized by the camera; and a driving means for lifting the printing table to allow the substrate to be brought into contact with the mask.

16. The solder ball printing apparatus according to claim 12, further comprising:
 a printing table for fixing the substrate;
 a camera with an upper viewing field and a lower viewing field for recognizing an electrode pattern on the substrate on the printing table and an electrode pattern of the mask;
 a driving apparatus for driving and aligning the printing table on the basis of the result recognized by the camera; and
 a driving means for lifting the printing table to allow the substrate to be brought into contact with the mask.

17. The solder ball printing apparatus according to claim 1, wherein said plurality of solder ball rotating and collecting mechanisms are configured to collect solder balls that have been dispersed without being loaded by the wire member, press said collected solder balls into the opening area of the mask, and prevent said collected solder balls from being leaked outside from inside the solder ball shaking and discharging unit.

* * * * *